US 11,888,143 B2

(12) United States Patent
Trassl

(10) Patent No.: US 11,888,143 B2
(45) Date of Patent: Jan. 30, 2024

(54) METHOD OF MANUFACTURING AN ANODE STRUCTURE, VACUUM DEPOSITION SYSTEM, ANODE STRUCTURE, AND LITHIUM BATTERY LAYER STACK

(71) Applicant: Applied Materials, Inc., Santa Clara, CA (US)

(72) Inventor: Roland Trassl, Giessen (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 123 days.

(21) Appl. No.: 17/540,443

(22) Filed: Dec. 2, 2021

(65) Prior Publication Data

US 2022/0190308 A1 Jun. 16, 2022

Related U.S. Application Data

(60) Provisional application No. 63/125,566, filed on Dec. 15, 2020.

(51) Int. Cl.
*H01M 4/04* (2006.01)
*C23C 16/44* (2006.01)
(Continued)

(52) U.S. Cl.
CPC ........... *H01M 4/0421* (2013.01); *C23C 16/44* (2013.01); *H01M 4/139* (2013.01); *H01M 2004/028* (2013.01)

(58) Field of Classification Search
CPC ......... H01M 2004/027; H01M 4/0402; H01M 4/0404; H01M 4/0407; H01M 4/0421;
(Continued)

(56) References Cited

U.S. PATENT DOCUMENTS

2017/0356078 A1* 12/2017 Chung ................. C23C 14/083

FOREIGN PATENT DOCUMENTS

CN 109328413 A 2/2019
JP 2011-154786 A 8/2011
(Continued)

OTHER PUBLICATIONS

Office Action dated Jul. 1, 2022, TW Patent Application 110144762.
(Continued)

*Primary Examiner* — Matthew T Martin
*Assistant Examiner* — Bartholomew A Hornsby
(74) *Attorney, Agent, or Firm* — Patterson + Sheridan, LLP

(57) ABSTRACT

A method of manufacturing an anode structure (10) for a lithium battery is described. The method includes a first deposition of lithium on a first flexible support (21) to provide a lithium anode-first sublayer (12-1) with a first lithium surface (31); a second deposition of lithium on a second flexible support (22) to provide a lithium anode-second sublayer (12-2) with a second lithium surface (32); and combining the lithium anode-first sublayer (12-1) and the lithium anode-second sublayer (12-2) by pressing the first lithium surface and the second lithium surface together to form a lithium metal anode layer (12). Further described are a lithium battery layer stack with an anode structure manufactured according to the described method, and a vacuum deposition system for manufacturing an anode structure as described herein.

10 Claims, 3 Drawing Sheets

(51) Int. Cl.
 *H01M 4/139* (2010.01)
 *H01M 4/02* (2006.01)
(58) Field of Classification Search
 CPC .. H01M 4/0423; H01M 4/0426; H01M 4/043;
  H01M 4/0435; H01M 4/8896
 See application file for complete search history.

(56) References Cited

FOREIGN PATENT DOCUMENTS

| KR | 10-2004-0035909 A | 4/2004 |
|---|---|---|
| TW | 201538769 A | 10/2015 |
| WO | 00/58029 A1 | 10/2000 |

OTHER PUBLICATIONS

International Search Report and Written Opinion, PCT/US2021/061547, dated Apr. 11, 2022.

\* cited by examiner

METHOD OF MANUFACTURING AN ANODE STRUCTURE, VACUUM DEPOSITION SYSTEM, ANODE STRUCTURE, AND LITHIUM BATTERY LAYER STACK

TECHNICAL FIELD

Embodiments of the present disclosure relate to methods of manufacturing an anode structure for a lithium battery, particularly a lithium battery that uses a metallic lithium layer as the anode. Specifically, methods described herein relate to methods of manufacturing a solid-state lithium battery with a lithium metal anode and a solid-state electrolyte (SSE) layer. Embodiments of the present disclosure further relate to anode structures for lithium batteries, and to lithium battery layer stacks including the described anode structures. Further embodiments relate to a vacuum deposition system for manufacturing an anode structure for a lithium battery. Specifically, the vacuum deposition systems described herein may be roll-to-roll vacuum deposition systems configured for evaporating lithium on flexible support layers.

BACKGROUND

Electrochemical storage systems are currently becoming increasingly valuable in many fields of everyday life. High-capacity electrochemical energy storage devices, such as lithium batteries, specifically lithium-ion (Li-ion) batteries and lithium metal batteries, are used in a growing number of applications, including portable electronics, medical, transportation, grid-connected large energy storage, renewable energy storage, and uninterruptible power supply (UPS). Traditional lead/sulfuric acid batteries often lack the capacitance and are often inadequately cyclable for these applications. Lithium batteries are thought to be the better solution.

Typically, lithium-ion batteries do not contain any metallic lithium but instead use a graphitic material as the anode. However, the use of graphite results in a lower capacity in comparison with the use of metallic lithium. Currently, the industry is moving away from graphitic-based anodes to silicon-blended graphite to increase the energy density. However, silicon blended graphite anodes suffer from first cycle capacity loss which can be reduced by lithium metal deposition to replenish first cycle capacity loss of silicon blended graphite anodes. The first-cycle loss is also an issue with Si anodes, but can be compensated by applying additional lithium before cycling, the so-called pre-lithiation. Another issue is swelling, i.e. volume expansion during charge/discharge (up to 400%) which needs to be solved.

Another approach relates to lithium metal batteries that use a lithium metal anode, i.e. a metallic lithium layer, as the anode. The energy density of a pure lithium metal anode is considerably higher than the energy density of anodes comprising graphite or silicon. However, the manufacturing of a lithium metal anode is challenging for a plurality of reasons.

Lithium is an alkali metal. Like the heavy element homologs of the first main group, lithium is characterized by a strong reactivity with a variety of substances. Lithium reacts violently with water, alcohols and other substances that contain protic hydrogen, often resulting in ignition. Lithium is unstable in air and reacts with oxygen, nitrogen and carbon dioxide. Lithium is normally handled under an inert gas atmosphere (noble gases such as argon), and the strong reactivity of lithium necessitates that other processing operations also be performed in an inert gas atmosphere. Further, it is to be noted that lithium reacts heavily in the presence of water. When no water is present, for example in a dry room, the reaction with $O_2$, $N_2$ and other gases is slow at room temperature. Accordingly, from a safety point of view, there is no issue when handled in dry atmosphere. However, some undesired reactions may still occur on the lithium surfaces that are to be integrated into a battery. Accordingly, lithium provides several challenges when it comes to processing, storage, and transportation.

In order to avoid a reaction of a lithium metal layer with surrounding molecules, e.g. in air, the lithium surface of the lithium metal layer is typically passivated or otherwise protected, e.g. with a protection or interface layer, before further processing and integration into a battery structure. For example, after the deposition of a lithium metal layer on a support layer, the exposed lithium surface of metal lithium layer may be protected with a protection layer, and the anode structure can then be processed further by providing other layers on the protection layer and/or by handling in air. However, the protection layer or passivation layer on the metal lithium layer may negatively affect the current transport and/or the energy density of the finished lithium battery.

Accordingly, it would be beneficial to provide improved methods for manufacturing anode structures for lithium batteries that solve at least some of the issues mentioned above. In particular, it would be beneficial to provide a lithium battery layer stack with a lithium metal anode layer for producing a compact lithium battery enabling a high energy density. Further, it would be beneficial to provide an improved vacuum deposition system for the manufacture of anode structures for lithium batteries.

SUMMARY

In light of the above, a method of manufacturing an anode structure for a lithium battery, an anode structure, a lithium battery layer stack, and a vacuum deposition system according to the independent claims are provided. Further aspects, advantages, and features are apparent from the dependent claims, the description, and the accompanying drawings.

According to an aspect of the present disclosure, a method of manufacturing an anode structure for a lithium battery is provided. The method includes a first deposition of lithium on a first flexible support to provide a lithium anode-first sublayer with a first lithium surface; a second deposition of lithium on a second flexible support to provide a lithium anode-second sublayer with a second lithium surface; and combining the lithium anode-first sublayer and the lithium anode-second sublayer by pressing the first lithium surface and the second lithium surface together to form a lithium metal anode layer.

In some embodiments, the first flexible support may be an anode current collector, e.g., a metal foil such as a copper foil. In some embodiments, the second flexible support may include a separator or a solid state electrolyte (SSE) layer, on which the lithium anode-second sublayer is directly deposited.

According to a further aspect of the present disclosure, an anode structure manufactured according to any of the methods described herein is provided.

According to a further aspect, a lithium battery layer stack is provided, particularly including an anode structure according to any of the embodiments described herein. The lithium battery layer stack includes a cathode current collector, a cathode on the cathode current collector, a separator on the cathode current collector, a lithium metal anode layer on the separator, and an anode current collector on the lithium metal anode layer. The lithium metal anode layer is a pure lithium film in direct contact with both the anode current collector and the separator. In particular, the lithium metal anode layer has a first (pristine) lithium interface in direct contact with the anode current collector and a second (pristine) lithium interface in direct contact with the separator.

The separator may electrically separate the cathode from the lithium metal anode layer that constitutes the anode. The battery layer stack may be filled with a liquid electrolyte.

In some embodiments, a lithium battery layer stack is provided that is configured for making solid-state battery (SSB). The lithium battery layer stack includes a cathode current collector, a cathode on the cathode current collector, a solid state electrolyte layer on the cathode current collector, a lithium metal anode layer on the solid state electrolyte layer, and an anode current collector on the lithium metal anode layer. The lithium metal anode layer is a pure lithium film in direct contact with both the anode current collector and the solid state electrolyte layer. In particular, the lithium metal anode layer has a first (pristine) lithium interface in direct contact with the anode current collector and a second (pristine) lithium interface in direct contact with the solid state electrolyte (SSE) layer.

According to a further aspect, a vacuum deposition system for manufacturing an anode structure is provided, particularly according to any of the methods described herein. The vacuum deposition system includes a first lithium deposition apparatus for depositing a lithium anode-first sublayer with a first lithium surface on a first flexible support, particularly by evaporation; a second lithium deposition apparatus for depositing a lithium anode-second sublayer with a second lithium surface on a second flexible support, particularly by evaporation; and a combining device for combining the lithium anode-first sublayer and the lithium anode-second sublayer by pressing the first lithium surface and the second lithium surface together to form a lithium metal anode layer.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus and at products manufactured according to the described methods or by the described apparatuses. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

In the present disclosure, an "anode structure" can be understood as a structure that comprises an anode electrode for a lithium battery. In particular, an "anode structure" according to the present disclosure can be understood as a layer structure having multiple layers, also referred to as a layer stack, including an anode electrode layer and further layers that are arranged above and/or below the anode electrode layer.

In the present disclosure, a "flexible support" or "flexible substrate" can be understood as a bendable substrate. The term "flexible support" or "substrate" may be synonymously used with the term "foil" or the term "web" and encompasses foils having one or more layers deposited thereon.

In the present disclosure, a "lithium film" or "lithium layer" can be understood as a layer including lithium as a main component. In particular, a lithium layer may consist of lithium and may have a lithium content of 90% or more, particularly 99% or more, or even 99.9% or more. Providing an anode that is a lithium layer consisting of lithium, i.e. being made of a pure metallic lithium, beneficially provides for a higher energy density due to the lower weight and thickness of a lithium metal anode as compared to other anode types.

Figure 1:
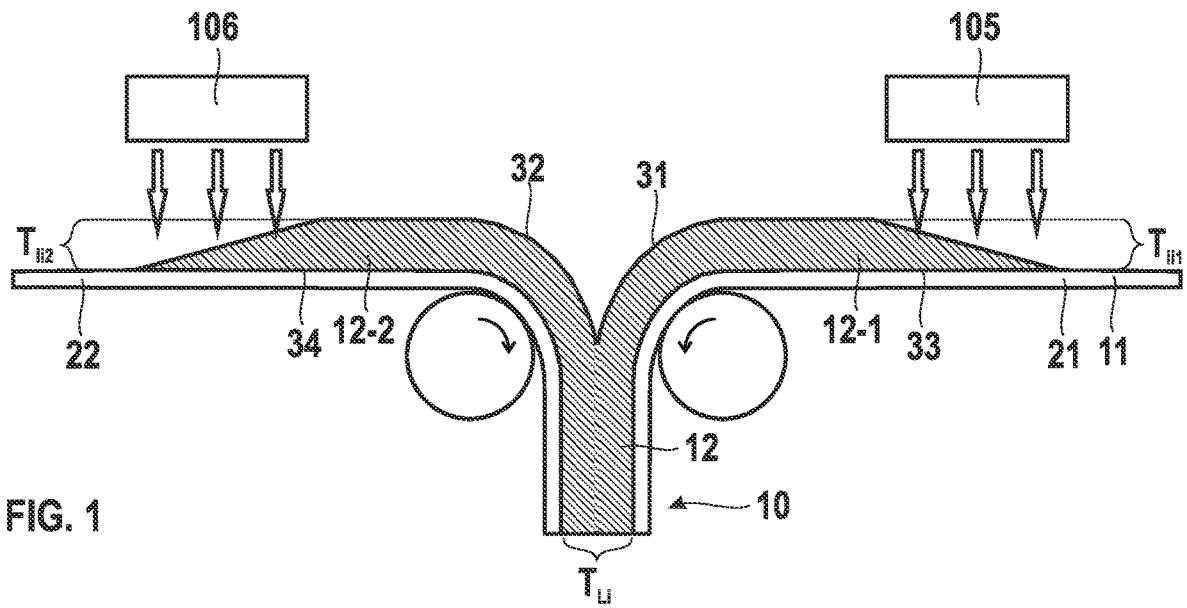
FIG. 1 schematically illustrates a method of manufacturing an anode structure according to embodiments described herein.

FIG. 1 schematically illustrates a method of manufacturing an anode structure 10 for a lithium battery according to embodiments described herein. The method may be conducted with a vacuum deposition system in a vacuum environment, particularly inside one or more vacuum chambers of the vacuum deposition system.

The method includes a first deposition of lithium on a first flexible support 21 by evaporation to form a lithium anode-first sublayer 12-1 with an exposed first lithium surface 31. Specifically, lithium may be evaporated on the first flexible support 21 with a first lithium deposition apparatus 105 to form the lithium anode-first sublayer 12-1. The lithium anode-first sublayer may be a pure lithium layer (i.e., a layer with a lithium content>99%, or even >99.9%). Specifically, the lithium content of the lithium anode-first sublayer 12-1 may be 90% or more, particularly 99% or more, or even 99.9% or more.

Since the first deposition is conducted under vacuum in a vacuum deposition system, the first lithium surface 31 is a pristine lithium surface. In particular, there are essentially no molecules that could react with the first lithium surface 31, such that—as long as the lithium anode-first sublayer 12-1 remains and is further processed in the vacuum environment of the vacuum deposition system—there is no need to protect the first lithium surface by passivation or with a protection layer to enable safe handling or transportation.

The method further includes a second deposition of lithium on a second flexible support 22 by evaporation to form a lithium anode-second sublayer 12-2 with an exposed second lithium surface 32. Specifically, lithium may be evaporated on the second flexible support 22 with a second lithium deposition apparatus 106 to form the lithium anode-second sublayer 12-2. The lithium anode-second sublayer may be a pure lithium layer. Specifically, the lithium content of the lithium anode-second sublayer 12-2 may be 90% or more, particularly 99% or more, or even 99.9% or more.

The second flexible support 22 may include a separator or a solid state electrolyte (SSE) layer on which the lithium anode-second sublayer 12-2 is directly deposited.

Since the second deposition is conducted under vacuum in the vacuum deposition system, the second lithium surface 32 is a pristine lithium surface. In particular, there are essentially no molecules that could react with the second lithium surface 32, such that—as long as the lithium anode-second sublayer remains and is processed further in the vacuum deposition system—there is no need to protect the second lithium surface by passivation or with a protection layer to enable safe handling or transportation.

In some embodiments, the first flexible support 21 and the second flexible support 22 are flexible web substrates, e.g., flexible foils having optionally one or more layers provided thereon, that are moved along a respective web transportation path past one or more lithium evaporators, particularly in a roll-to-roll deposition system. Specifically, the first flexible support 21 is unwound from a first unwinding roll and moved by one or more guiding rolls past one or more first lithium evaporators where the first flexible support 21 is coated with the lithium anode-first sublayer 12-1. Similarly, the second flexible support 22 may be unwound from a second unwinding roll and moved by one or more guiding rolls past one or more second lithium evaporators where the second flexible support 22 may be coated with the lithium anode-second sublayer 12-2.

The method further includes combining the lithium anode-first sublayer 12-1 and the lithium anode-second sublayer 12-2 by pressing the first lithium surface 31 and the second lithium surface 32 together to form a lithium metal anode layer 12. In particular, the first flexible support 21 having the lithium anode-first sublayer 12-1 deposited thereon is pressed together with the second flexible support 22 having the lithium anode-second sublayer 12-2 deposited thereon to provide a combined layer stack having the lithium metal anode layer 12 (consisting of two lithium sublayers 12-1 and 12-2) sandwiched between the first and second flexible supports. The combining may include bringing the first lithium surface 31 of the lithium anode-first sublayer 12-1 in direct contact with the second lithium surface 32 of the lithium anode-second sublayer 12-2 to provide one (thicker) lithium layer comprising the two lithium sublayers and forming the lithium metal anode layer 12. In some embodiments, the lithium metal anode layer 12 includes the lithium anode-first sublayer 12-1 and the lithium anode-second sublayer 12-2 stacked on top of each other such as to form a single uniform lithium layer having the combined thickness of the first and second lithium sublayers.

In some embodiments, the first deposition, the second deposition, and the combining are conducted continuously under vacuum, particularly within one vacuum deposition system, in order to avoid a contamination and/or a reaction of the first and second lithium surfaces before the combination. In particular, the method described herein may be conducted in several vacuum chambers of a vacuum deposition system that are directly connected with each other to provide a continuous vacuum environment. After the combination, the lithium metal anode layer 12 is protected on two opposing main surfaces thereof by the first flexible support 21 and by the second flexible support 22, respectively, such that the manufactured anode structure no longer has an exposed lithium surface and can be taken off the vacuum. Further, after the combination, the first lithium surface 31 and the second lithium surface 32 are protected, being pressed together and standing in direct area contact to form a pure lithium interface (i.e., an interface comprising two contacting lithium surfaces).

According to embodiments described herein, an anode structure 10 with a lithium metal anode layer 12 that is a pure lithium layer covered and protected on two opposing sides by a respective flexible support can be provided. The anode structure 10 is flexible and can be used for the production of a lithium battery. The lithium metal anode layer 12 may, for example, have a lithium content of 90% or more, particularly 99% or more.

The first flexible support 21 may be an anode current collector meant for being integrated in the lithium battery, and the second flexible support 22 may include a separator or a solid state electrolyte layer meant for being integrated in the lithium battery. Accordingly, in the anode structure 10, the lithium metal anode layer 12 may be sandwiched directly between the anode current collector and the solid state electrolyte layer or separator, without further layers (such as a passivation, an interface layer, or a Li protection layer) that would negatively affect the charge transfer and/or energy density provided by the lithium battery.

According to some embodiments described herein, a first interface 33 between the lithium metal anode layer 12 and the first flexible support 21 is a lithium evaporation interface, and a second interface 34 between the lithium metal anode layer 12 and second flexible support 22 is a lithium evaporation interface. A "lithium evaporation interface" as used herein refers to a layer interface in which a lithium layer is directly provided on a support layer by evaporation. A lithium evaporation interface inherently provides an excellent adhesion of the lithium layer on the support layer and reduces or entirely avoids a contamination at the interface between the lithium layer and the support layer by foreign molecules.

For example, if a contact layer of a different material (for example a metal foil) is mechanically pressed onto an exposed lithium surface of a lithium layer for protecting the lithium layer, there is a risk of a bad contact and a bad adhesion at the interface between the lithium layer and the contact layer. On the other hand, a lithium metal anode layer with two lithium evaporation interfaces at the two opposing main sides thereof, as described herein, provides a good adhesion and a good contact to the support layers on both sides thereof.

Known lithium batteries with a lithium metal anode typically have a passivation layer or another additional protection layer on at least one side of a lithium metal anode, in order to enable a transport and handling of the anode structure for further processing and integration in a battery layer stack. In contrast, according to embodiments described herein, the lithium metal anode layer 12 has two pristine lithium interfaces on both sides thereof, because the two lithium sublayers constituting the lithium metal anode layer 12 are directly evaporated on the flexible supports that are integrated in the final lithium battery.

According to some embodiments, which can be combined with other embodiments described herein, the first flexible support 21 includes an anode current collector 11, and the first deposition of lithium is conducted directly on the anode current collector 11. In other words, lithium is directly evaporated on the anode current collector 11 that may be, for example, a metal foil.

In particular, the anode current collector 11 may be a metal foil, particularly a copper foil, and the lithium may be directly evaporated on the metal foil for forming the lithium anode-first sublayer 12-1.

Alternatively, the anode current collector 11 may include a polymer foil with a metal coating, e.g., a copper coating on one or two sides of the polymer foil, and the first deposition of lithium may be conducted directly on the metal coating of the anode current collector 11. Also here, lithium is directly evaporated on the metal of the anode current collector 11, ensuring a good contact and conductivity between the anode and the anode current collector.

According to some embodiments, a lithium evaporation interface is provided between the anode current collector 11 and the lithium metal anode layer 12, providing a good adhesion of the anode on the anode current collector as well as a good electrical contact between the anode and the anode current collector, which may be a copper foil.

Specifically, a pristine lithium interface (obtained by lithium evaporation) may be provided between the lithium metal anode layer 12 and the anode current collector 11, which is different from other solutions that have a passivation layer, a protection layer, or another interface layer between the anode and the anode current collector.

In some embodiments, which can be combined with other embodiments described herein, the second flexible support 22 includes a solid state electrolyte layer 13 (SSE layer), and the second deposition is conducted directly on the SSE layer. In other words, lithium is evaporated directly on the SSE layer for forming the lithium anode-second sublayer 12-2. Such an embodiment is illustrated in FIG. 2.

Figure 3:
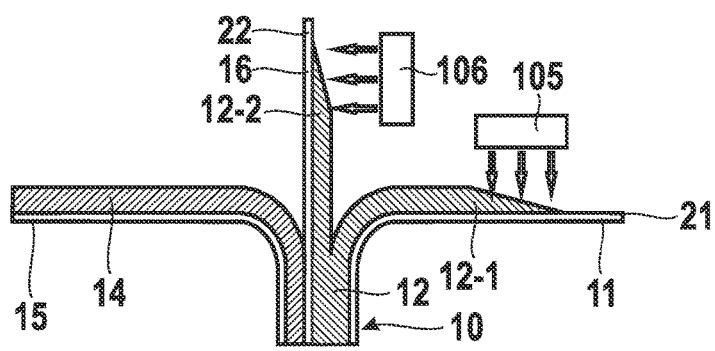
FIG. 3 schematically illustrates a method of manufacturing an anode structure according to embodiments described herein.

In some embodiments, which can be combined with other embodiments described herein, the second flexible support 22 comprises a separator 16, and the second deposition of lithium is conducted directly on the separator 16. In other words, lithium is evaporated directly on the separator 16 for forming the lithium anode-second sublayer 12-2. Such an embodiment is illustrated in FIG. 3.

Figure 2:
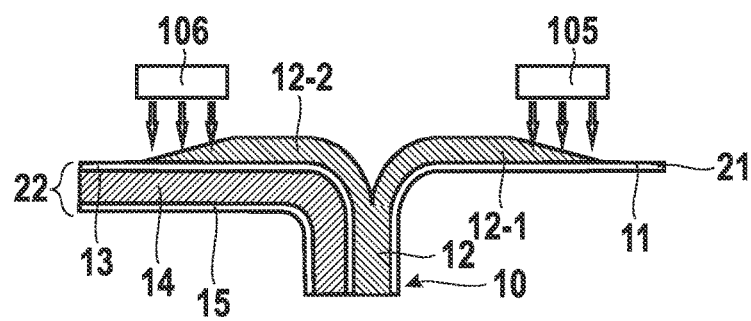
FIG. 2 schematically illustrates a method of manufacturing an anode structure according to further embodiments described herein.

FIG. 2 schematically illustrates a method of manufacturing an anode structure according to embodiments described herein. The method illustrated in FIG. 2 essentially corresponds to the method described above, such that reference can be made to the above explanations, which are not repeated here.

The second flexible support 22 in the embodiment of FIG. 2 includes a solid state electrolyte layer 13, and the second deposition of lithium is conducted directly on the solid state electrolyte layer.

In particular, the second flexible support 22 may be a layer stack that includes a cathode current collector 15, a cathode 14 on the cathode current collector, and the solid state electrolyte layer 13 on the cathode 14. The second deposition of lithium for forming the lithium anode-second sublayer 12-2 is conducted directly on the solid state electrolyte layer 13 of said layer stack.

For example, in some embodiments, the cathode material for providing the cathode 14 may first be deposited on the cathode current collector 15, e.g. by slot-die coating, and the solid state electrolyte layer 13 may then be deposited on the cathode 14 to produce the second flexible support 22. The second flexible support 22 may afterward directly be coated with lithium for forming the lithium anode-second sublayer 12-2 in the same vacuum deposition apparatus. Alternatively, the second flexible support 22 including the cathode current collector 15, the cathode 14, and the solid state electrolyte layer 13 may be transported through an atmospheric environment, e.g. in a coiled form as a roll, and may then be inserted in another vacuum deposition system for being coated with lithium.

In some embodiments, which can be combined with other embodiments described herein, the cathode current collector 15 may be or may include an aluminum foil. In some embodiments, which can be combined with other embodiments described herein, the cathode 14 may be an NMC cathode. In some embodiments, which can be combined with other embodiments described herein, the anode current collector 11 may be or may include a copper foil or a copper coating.

As it is schematically depicted in FIG. 2, after the first deposition of lithium on the anode current collector 11 and the second deposition of lithium on the solid state electrolyte layer 13, the first flexible support 21 with the deposited lithium sublayer and the second flexible support 22 with the deposited lithium sublayer are pressed together, such that the exposed lithium surfaces of the lithium anode-first sublayer 12-1 and the lithium anode-second sublayer 12-2 are contacted and a unitary lithium layer is formed that constitutes the lithium metal anode layer 12.

The manufactured lithium battery layer stack can be processed further to produce a lithium battery that is a solid-state battery (SSB), i.e. a lithium battery that does not have a liquid electrolyte for enabling an ion transport.

FIG. 3 schematically illustrates a method of manufacturing an anode structure according to embodiments described herein. The method illustrated in FIG. 3 essentially corresponds to the methods described above, such that reference can be made to the above explanations, which are not repeated here.

The second flexible support 22 in the embodiment of FIG. 3 is a separator 16, and the second deposition of lithium is conducted directly on the separator 16. Alternatively, the second flexible support 22 may be a layer stack with the separator 16 as a top layer on which the second deposition of lithium is conducted. Also here, the first deposition of lithium may be conducted directly on the anode current collector 11, e.g. on a copper foil.

As it is schematically depicted in FIG. 3, after the first deposition of lithium on the anode current collector 11 and the second deposition of lithium on the separator 16, the first flexible support 21 with the deposited lithium sublayer and the second flexible support 22 with the deposited lithium sublayer are pressed together, such that the exposed lithium surfaces of the lithium anode-first sublayer 12-1 and the lithium anode-second sublayer 12-2 are contacted and a unitary lithium layer is formed that constitutes the lithium metal anode layer 12.

In some embodiments, the anode structure 10 is manufactured as follows: a cathode 14, for example an NMC cathode, may be deposited on a cathode current collector 15, for example on an aluminum foil, to provide a cathode layer stack. The cathode layer stack may be combined with the second flexible support 22 having the lithium anode-second sublayer 12-2 deposited thereon and with the first flexible support 21 having the lithium anode-first sublayer 12-1 deposited thereon, as it is schematically depicted in FIG. 3, particularly by pressing together the above three layer stacks.

Specifically, the combining may include pressing together (1) the first flexible support 21 having the lithium anode-first sublayer 12-1 deposited thereon, (2) the second flexible support 22 having the lithium anode-second sublayer 12-2 deposited thereon, and (3) a cathode layer stack that includes a cathode current collector 15 having a cathode 14 provided thereon. The layer stacks (1), (2) and (3) may be pressed together simultaneously or subsequently. For example, the layer stacks (1), (2), and (3) may be pressed together with two pressing rolls or with several pairs of pressing rolls that are biased toward each other (see FIG. 1). The combining is conducted such that the first lithium surface of the lithium anode-first sublayer 12-1 and the second lithium surface of the lithium anode-second sublayer 12-2 are brought in direct contact with each other, such that the lithium metal anode layer 12 is formed. For example, the pressing rolls may exert pressure on the cathode current collector 15 and on the anode current collector 11, such that the layers arranged between the cathode current collector 15 and the anode current collector 11 are pressed together and a combined layer stack is produced.

After the combining, a liquid electrolyte may be inserted in the space between the anode and the cathode where the separator is arranged. Specifically, the battery layer stack may be filled with a liquid electrolyte.

In some embodiments, which can be combined with other embodiments described herein, the manufacturing method described herein (including the first and second deposition as well as the combining) is conducted under continuous vacuum in a roll-to-roll processing system. Specifically, the first deposition may be conducted by a first lithium deposition apparatus with a first coating drum, and the first flexible support may be guided on a drum surface of the first coating drum past one or more first lithium evaporators for depositing the lithium anode-first sublayer thereon. The first flexible support may be unwound from a first unwinding roll and be moved to the first coating drum by a first web transportation system that may include one or more guide rollers.

The second deposition may be conducted by a second lithium deposition apparatus with a second coating drum, and the second flexible support may be guided on a drum surface of the second coating drum past one or more second lithium evaporators for depositing the lithium anode-second sublayer thereon. The second flexible support may be unwound from a second unwinding roll and be moved to the second coating drum by a second web transportation system that may include one or more guide rollers. Such a roll-to-roll processing system allows a quick, reliable and high-quality lithium layer deposition and web combination, particularly inside one vacuum deposition system under a continuous vacuum environment.

In some embodiments, which can be combined with other embodiments described herein, the lithium anode-first sublayer is deposited with a first thickness $T_{Li1}$ of 1 µm≤$T_{Li1}$≤20 µm, the lithium anode-second sublayer is deposited with a second thickness $T_{Li2}$ of 1 µm≤$T_{Li2}$≤20 µm, and/or the lithium metal anode layer 12 has a combined thickness $T_{Li}$ of 2 µm≤$T_{Li}$≤40 µm, particularly 3 µm≤$T_{Li}$<25 µm, more particularly 5 µm≤$T_{Li}$≤15 µm, for example about 10 µm.

Embodiments of the present disclosure also relate to an anode structure 10 manufactured according to any of the methods described herein.

Figure 4:
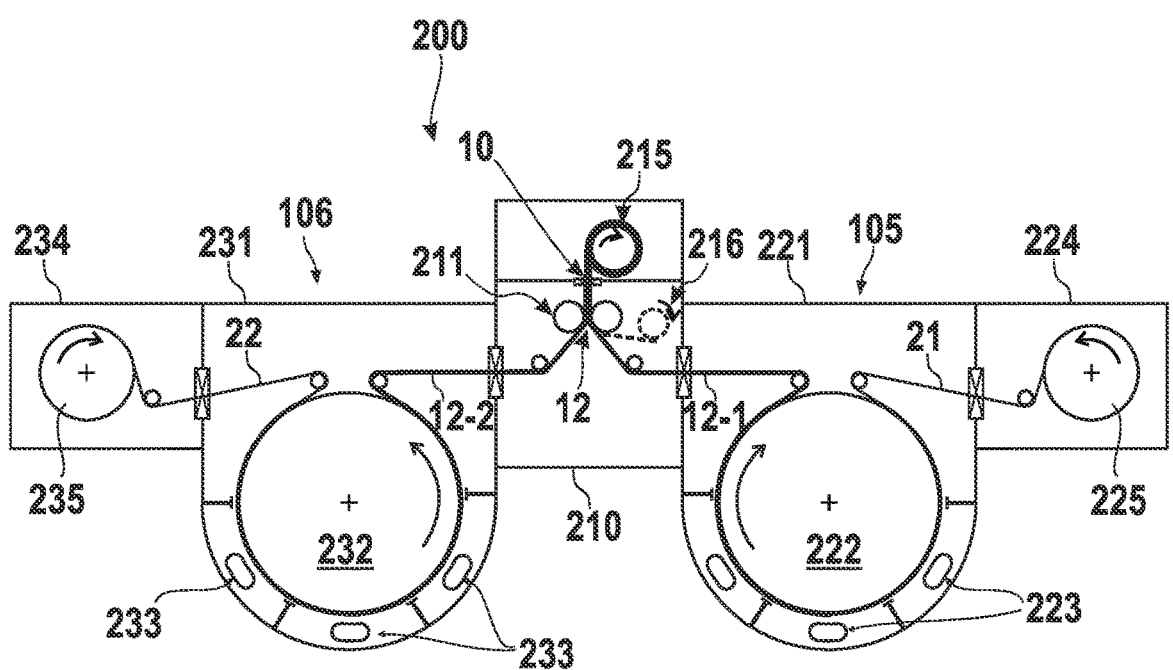
FIG. 4 shows a schematic view of a vacuum deposition system for manufacturing an anode structure according to embodiments described herein.

FIG. 4 shows a schematic view of a vacuum deposition system 200 for manufacturing an anode structure 10 as described herein.

The vacuum deposition system 200 includes a first lithium deposition apparatus 105 for depositing a lithium anode-first sublayer 12-1 with a first lithium surface on a first flexible support 21, a second lithium deposition apparatus 106 for depositing a lithium anode-second sublayer 12-2 with a second lithium surface on a second flexible support 22, and a combining device 211 for combining the lithium anode-first sublayer and the lithium anode-second sublayer by pressing the first lithium surface and the second lithium surface together to form a lithium metal anode layer 12.

The first lithium deposition apparatus 105 may include one or more first lithium evaporators 223, and the second lithium deposition apparatus 106 may include one or more second lithium evaporators 233.

The vacuum deposition system 200 may be a roll-to-roll processing system for depositing lithium on flexible web substrates that are unwound from storage spools before the deposition and are moved past one or more lithium evaporators by one or more web transportation systems.

In some embodiments, which can be combined with other embodiments described herein, the first lithium deposition apparatus 105 includes a first coating drum 222 configured for guiding the first flexible support 21 past one or more first lithium evaporators 223 in a first vacuum deposition chamber 221, and the second lithium deposition apparatus 106 may include a second coating drum 232 configured for guiding the second flexible support 22 past one or more second lithium evaporators 233 in a second vacuum deposition chamber 231. For example, two, three or more first lithium evaporators may be arranged at a periphery of the first coating drum 222 for directing evaporated lithium toward the drum surface of the first coating drum 222. Similarly, two, three or more second lithium evaporators may be arranged at a periphery of the second coating drum 232 for directing evaporated lithium toward the drum surface of the second coating drum 232, as it is schematically depicted in FIG. 4.

In some implementations, the vacuum deposition system 200 may include a vacuum combination chamber 210 arranged between the first vacuum deposition chamber 221 and the second vacuum deposition chamber 231, wherein the combining device 211 is arranged in the vacuum combination chamber 210. Alternatively or additionally, the vacuum combination chamber 210 may be arranged downstream of the first vacuum deposition chamber 221 in the web transport direction of the first flexible support 21 and downstream of the second vacuum deposition chamber 231 in the web transport direction of the second flexible support 22. Accordingly, the first flexible support 21 and the second flexible support 22 can be combined after the deposition of the respective lithium sublayer thereon in the vacuum combination chamber 210.

In some embodiments, the vacuum deposition system includes a first web transportation system configured for transporting the first flexible support 21 from a first unwinding roll 225 to the first coating drum 222 and from the first coating drum 222 to the combining device 211. Further, a second web transportation system may be provided that is configured for transporting the second flexible support 22 from a second unwinding roll 235 to the second coating drum 232 and from the second coating drum 232 to the combining device 211. In the combining device 211, the first lithium surface and the second lithium surface face toward each other and can be brought in direct contact by the combining device 211, so that the lithium surfaces adhere to each other.

The first unwinding roll 225 can be arranged in a first spool chamber 224, and the second unwinding roll 235 can be arranged in a second spool chamber 234.

In some embodiments, which can be combined with other embodiments described herein, the combining device 211 may include a first press roll biased toward a second press roll, and the first flexible support 21 with the deposited lithium anode-first sublayer and the second flexible support 22 with the deposited lithium anode-second sublayer can be guided between and pressed together by the first and the second press rolls of the combining device 211.

A wind-up spool 215 may be arranged downstream of the combining device 211, optionally in a separate wind-up chamber that can be separated from the vacuum combination chamber 210 with a valve. The combined layer stack downstream of the combining device 211 that constitutes a lithium battery layer stack can be wound on the wind-up spool 215. The wind-up spool 215 can be taken off the vacuum deposition system 200 for being transported to a further processing apparatus.

The vacuum deposition system 200 of FIG. 4 can be operated as follows:

The first flexible support 21 may be an anode current collector, particularly a copper foil, that is unwound from the first unwinding roll 225 and transported to the first coating drum 222 with the first web transporting system. Lithium may be deposited directly on the anode current collector with the one or more first lithium evaporators 223 while the anode current collector is supported on the drum surface of the first coating drum 222. The Li-coated anode current collector may be transported to the combining device 211 in the vacuum combination chamber 210.

The second flexible support 22 that is a separator layer (optionally on top of other layers) may be unwound from the second unwinding roll 235 and transported to the second coating drum 232 from the second unwinding roll 235 with the second web transporting system. Lithium may be deposited directly on the separator layer with the one or more second lithium evaporators 233 while the separator layer is supported on the drum surface of the second coating drum 232. The Li-coated separator layer may be transported to the combining device 211 in the vacuum combination chamber 210.

Optionally, a cathode layer stack including a cathode current collector, e.g. an Al foil, and a cathode deposited thereon may be transported to the combining device 211 in the vacuum combination chamber 210. For example, the cathode layer stack may be unwound from a third unwinding roll 216.

The cathode layer stack, the Li-coated separator layer, and the Li-coated anode current collector may be combined with the combining device 211 to form a lithium battery layer stack, e.g. by pressing together said three layer stacks between a first and a second press roll or alternatively by subsequent pairs of press rolls. The Li-coated separator and the Li-coated anode current collector are pressed together with the exposed Li-surfaces of the lithium sublayers contacting each other, such as to form a continuous lithium layer that forms the lithium metal anode layer.

The manufactured lithium battery layer stack can be filled with a liquid electrolyte.

In an alternative embodiment, the second flexible support 22 is a layer stack that includes an SSE layer on the top of the layer stack, e.g. on top of a cathode and a cathode current collector. The second flexible support 22 is transported to the second coating drum 232 with the second web transporting system. Lithium is deposited directly on the SSE layer with the one or more second lithium evaporators 233 while the rear surface of the second flexible support 22 is supported on the drum surface of the second coating drum 232. The Li-coated second flexible support may be transported to the combining device 211 in the vacuum combination chamber 210 and combined with the Li-coated first flexible support to form a continuous lithium layer provided directly between the anode current collector and the SSE layer.

Figure 5:
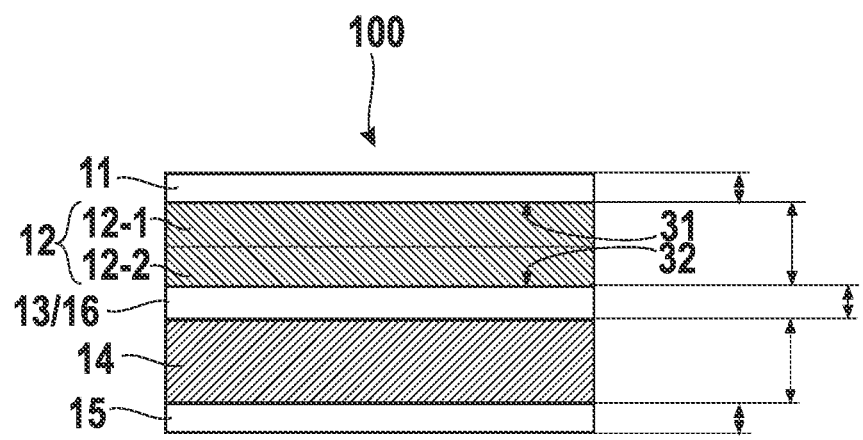
FIG. 5 shows a schematic sectional view of a lithium battery layer stack according to embodiments described herein.

FIG. 5 shows a schematic sectional view of a lithium battery layer stack 100 according to embodiments described herein.

A lithium battery typically includes two electrodes of opposing polarity, namely a negative anode and a positive cathode. The cathode and the anode are insulated by a separator arranged between the cathode and the anode to prevent short circuits between the cathode and the anode. The battery includes an electrolyte which is used as an ion conductive matrix. Accordingly, the electrolyte is an ion conductor, which may be liquid, in gel form or solid. A solid state electrolyte may act as the separator. The separator is typically ion-pervious and permits an exchange of ions between the anode and cathode in a charge or discharge cycle. For example, the separator can be a porous polymeric ion-conducting polymeric substrate. In particular, the porous polymeric substrate may be a multi-layer polymeric substrate.

The lithium battery layer stack 100 described herein includes a cathode current collector 15, for example an Al foil, a cathode 14 on the cathode current collector 15, a separator 16 or a solid state electrolyte layer 13 on the cathode current collector, a lithium metal anode layer 12 on the separator 16 or solid state electrolyte layer 13, and an anode current collector 11, for example a copper foil, on the lithium metal anode layer 12. If a solid state electrolyte layer 13 is provided, the solid state electrolyte layer 13 can separate the anode from the cathode, such that no additional separator that is to be filled with a liquid electrolyte may be needed.

The lithium metal anode layer 12 is a pure lithium film in direct contact with both the anode current collector 11 and the separator 16 (or the solid state electrolyte layer 13).

Specifically, there may not be any further layer, such as a lithium protection layer or passivation layer, at the interface between the lithium metal anode layer 12 and the anode current collector 11. Further, there may not be any further layer at the interface between the lithium metal anode layer 12 and the separator 16 (or the solid state electrolyte layer 13). In particular, pristine lithium interfaces may be provided on both sides of the lithium metal anode.

In some embodiments, the first interface 33 between the lithium metal anode layer 12 and the anode current collector 11 is a lithium evaporation interface, and/or the second interface 34 between the lithium metal anode layer 12 and the separator 16 (or the solid state electrolyte layer 13) is a lithium evaporation interface. A lithium evaporation interface is produced by direct lithium evaporation on the respective support layer. A lithium evaporation interface is characterized by good adhesion and contact properties between the contacting layers.

In some implementations, the lithium metal anode layer 12 includes a lithium anode-first sublayer 12-1 and a lithium anode-second sublayer 12-2 directly contacting each other and adhering to each other.

In some embodiments, the cathode current collector 15 may be an Al foil or an Al coated polymer foil, particularly with a thickness of 1 μm or more and 15 μm or less.

In some embodiments, the cathode 14 may be an NMC cathode.

In some embodiments, the anode current collector 11 may be a copper foil or a copper coated polymer foil, particularly with a thickness of 1 μm or more and 15 μm or less.

Figure 6:
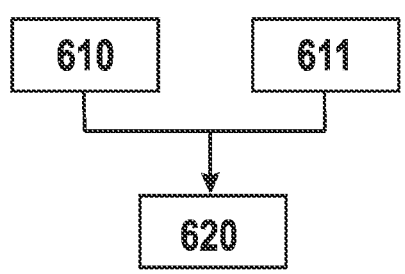
FIG. 6 is a flow diagram for illustrating a method of manufacturing an anode structure according to embodiments described.

FIG. 6 is a flow diagram for illustrating a method of manufacturing an anode structure according to embodiments described herein.

In box 610, lithium is deposited on a first flexible support by evaporation to form a lithium anode-first sublayer with an exposed first lithium surface. The first flexible support may be an anode current collector.

In box 611, lithium is deposited on a second flexible support by evaporation to form a lithium anode-second sublayer with an exposed second lithium surface. The second flexible support may include a separator or an SSE layer on which the lithium is directly deposited.

In box 620, the Li-coated first flexible support and the Li-coated second flexible support are pressed together, such that the first and second lithium surfaces contact each other and a lithium metal anode layer comprising two Li-sublayers that adhere to each other is formed. Specifically, the lithium anode-first sublayer and the lithium anode-second sublayer are combined by pressing the first lithium surface and the second lithium surface together to form the lithium metal anode layer.

In particular, the following embodiments are described herein:

Embodiment 1: A method of manufacturing an anode structure (10) for a lithium battery, comprising: a first deposition of lithium on a first flexible support (21) to provide a lithium anode-first sublayer with a first lithium surface (31); a second deposition of lithium on a second flexible support (22) to provide a lithium anode-second sublayer with a second lithium surface (32); and combining the lithium anode-first sublayer and the lithium anode-second sublayer by pressing the first lithium surface and the second lithium surface together to form a lithium metal anode layer (12).

Embodiment 2: The method of embodiment 1, wherein the first flexible support comprises an anode current collector (11), and the first deposition of lithium is conducted directly on the anode current collector.

Embodiment 3: The method of embodiment 2, wherein the anode current collector (11) is a metal foil, particularly a copper foil.

Embodiment 4: The method of embodiment 2, wherein the anode current collector (11) comprises a polymer foil with a metal coating, and the first deposition of lithium is conducted directly on the metal coating.

Embodiment 5: The method of any of embodiments 1 to 4, wherein the second flexible support comprises a solid state electrolyte layer (13), and the second deposition of lithium is conducted directly on the solid state electrolyte layer.

Embodiment 6: The method of embodiment 5, wherein the second flexible support (22) is a layer stack that comprises a cathode current collector (15), a cathode (14) on the cathode current collector, and the solid state electrolyte layer (13) on the cathode.

Embodiment 7: The method of any of embodiments 1 to 6, wherein the second flexible support (22) comprises a separator (16), and the second deposition of lithium is conducted directly on the separator.

Embodiment 8: The method of any of embodiments 1 to 7, wherein the combining comprises: pressing together (i) the first flexible support (21) having the lithium anode-first sublayer deposited thereon, (ii) the second flexible support (22) having the lithium anode-second sublayer deposited thereon, and (iii) a cathode current collector (15) having a cathode (14) provided thereon.

Embodiment 9: The method of any of embodiments 1 to 8 that is conducted continuously under vacuum in a roll-to-roll processing system.

Embodiment 10: The method of any of embodiments 1 to 9, wherein the lithium anode-first sublayer is deposited with a first thickness $T_{Li1}$ of 1 μm≤$T_{Li1}$≤20 μm, the lithium anode-second sublayer is deposited with a second thickness $T_{Li2}$ of 1 μm≤$L_{Li2}$≤20 μm, and the lithium metal anode layer has a combined thickness $T_{Li}$ of 2 μm<$T_{Li}$≤40 μm, particularly 5 μm≤$T_{Li}$≤15 μm.

Embodiment 11: A vacuum deposition system (200) for manufacturing an anode structure (10), comprising: a first lithium deposition apparatus (105) for depositing a lithium anode-first sublayer with a first lithium surface on a first flexible support (21); a second lithium deposition apparatus (106) for depositing a lithium anode-second sublayer with a second lithium surface on a second flexible support (22); and a combining device (211) for combining the lithium anode-first sublayer and the lithium anode-second sublayer by pressing the first lithium surface and the second lithium surface together to form a lithium metal anode layer (12).

Embodiment 12: The vacuum deposition system of embodiment 11, wherein the first lithium deposition apparatus (105) comprises a first coating drum (222) configured for guiding the first flexible support past one or more first lithium evaporators (223) in a first vacuum deposition chamber (221), and the second lithium deposition apparatus (106) comprises a second coating drum (232) configured for guiding the second flexible support past one or more second lithium evaporators (233) in a second vacuum deposition chamber (231).

Embodiment 13: The vacuum deposition system of embodiment 12, further comprising a vacuum combination chamber (210) between the first vacuum deposition chamber and the second vacuum deposition chamber and having the combining device (211) arranged therein.

Embodiment 14: The vacuum deposition system of embodiment 12 or 13, further comprising a first web transportation system configured for transporting the first flexible support from a first unwinding roll (225) to the first coating drum (222) and from the first coating drum to the combining device (211), and a second web transportation system configured for transporting the second flexible support from a second unwinding roll (235) to the second coating drum (232) and from the second coating drum to the combining device (211), such that the first lithium surface and the second lithium surface face each other in the combining device (211) and can be brought in direct contact by the combining device (211).

Embodiment 15: The vacuum deposition system of any of embodiments 11 to 14, wherein the combining device (211) comprises a first press roll biased toward a second press roll, such that the first flexible support (21) with the lithium anode-first sublayer and the second flexible support (22) with the lithium anode-second sublayer can be guided between and pressed together by the first and the second press rolls.

Embodiment 16: An anode structure (10), manufactured according to the method of any of embodiments 1 to 10.

Embodiment 17: A lithium battery layer stack (100), comprising: a cathode current collector (15), a cathode (14) on the cathode current collector, a separator (16) or a solid state electrolyte layer (13) on the cathode current collector, a lithium metal anode layer (12) on the separator or solid state electrolyte layer, and an anode current collector (11) on the lithium metal anode layer, wherein the lithium metal anode layer (12) is a pure lithium film in direct contact with both the anode current collector and the separator or solid state electrolyte layer.

Embodiment 18: The lithium battery layer stack of embodiment 17, wherein a first interface (33) between the lithium metal anode layer and the anode current collector is a lithium evaporation interface, and a second interface (34) between the lithium metal anode layer and the separator or solid state electrolyte layer is a lithium evaporation interface.

Embodiment 19: The lithium battery layer stack of embodiment 17 or 18, wherein the lithium metal anode layer (12) comprises a lithium anode-first sublayer (12-1) and a lithium anode-second sublayer (12-2) directly contacting each other.

Embodiment 20: The lithium battery layer stack of any of embodiments 17 to 19, wherein the cathode current collector (15) is an Al foil or an Al coated polymer foil, the cathode (14) is an NMC cathode, and/or the anode current collector (11) is a copper foil or a copper coated polymer foil.

In view of the above, it is to be understood that embodiments of the present disclosure beneficially provide an anode structure, a lithium battery layer stack, a method of manufacturing an anode structure, and a vacuum deposition system which are improved compared to the state of the art. Specifically, a lithium metal anode layer with pristine lithium interfaces sandwiched between an anode current collector and a separator or SSE layer is provided and can be manufactured according to the method described herein. Lithium dendrite growth can be reduced and the adhesion and contact of the lithium metal anode layer with the contacting layers can be substantially improved.

While the foregoing is directed to embodiments, other and further embodiments may be devised without departing from the basic scope, and the scope is determined by the claims that follow.

The invention claimed is:

1. A method of manufacturing an anode structure for a lithium battery, comprising:
   a first deposition of lithium on a first flexible support to provide a lithium anode-first sublayer with a first lithium surface;
   a second deposition of lithium on a second flexible support to provide a lithium anode-second sublayer with a second lithium surface; and
   combining the lithium anode-first sublayer and the lithium anode-second sublayer by pressing the first lithium surface and the second lithium surface together to form a lithium metal anode layer.

2. The method of claim 1, wherein the first flexible support comprises an anode current collector, and the first deposition of lithium is conducted directly on the anode current collector.

3. The method of claim 2, wherein the anode current collector is a metal foil.

4. The method of claim 2, wherein the anode current collector comprises a polymer foil with a metal coating, and the first deposition of lithium is conducted directly on the metal coating.

5. The method of claim 1, wherein the second flexible support comprises a solid state electrolyte layer, and the second deposition of lithium is conducted directly on the solid state electrolyte layer.

6. The method of claim 5, wherein the second flexible support is a layer stack that comprises a cathode current collector, a cathode on the cathode current collector, and the solid state electrolyte layer on the cathode.

7. The method of claim 1, wherein the second flexible support comprises a separator, and the second deposition of lithium is conducted directly on the separator.

8. The method of claim 1, wherein the combining comprises: pressing together (i) the first flexible support having the lithium anode-first sublayer deposited thereon, (ii) the second flexible support having the lithium anode-second sublayer deposited thereon, and (iii) a cathode current collector having a cathode provided thereon.

9. The method of claim 1 that is conducted continuously under vacuum in a roll-to-roll processing system.

10. The method of claim 1, wherein the lithium anode-first sublayer is deposited with a first thickness $T_{Li1}$ of 1 µm≤$T_{Li1}$≤20 µm, the lithium anode-second sublayer is deposited with a second thickness $T_{Li2}$ of 1 µm≤$T_{Li2}$≤20 µm, and the lithium metal anode layer has a combined thickness $T_{Li}$ of 2 µm $T_{Li}$≤40 µm.

* * * * *